(12) United States Patent
Jung et al.

(10) Patent No.: US 10,600,640 B2
(45) Date of Patent: Mar. 24, 2020

(54) REDUCTION OF SURFACE ROUGHNESS IN EPITAXIALLY GROWN GERMANIUM BY CONTROLLED THERMAL OXIDATION

(71) Applicant: Stratio, Inc., San Jose, CA (US)

(72) Inventors: Woo-Shik Jung, San Jose, CA (US);
Yeul Na, East Palo Alto, CA (US);
Youngsik Kim, Palo Alto, CA (US);
Jae Hyung Lee, Palo Alto, CA (US);
Jin Hyung Lee, Palo Alto, CA (US)

(73) Assignee: Stratio, Inc., Palo Alto, CA (US)

( * ) Notice: Subject to any disclaimer, the term of this patent is extended or adjusted under 35 U.S.C. 154(b) by 0 days.

(21) Appl. No.: 15/624,603

(22) Filed: Jun. 15, 2017

(65) Prior Publication Data

US 2017/0287706 A1    Oct. 5, 2017

Related U.S. Application Data

(63) Continuation of application No. PCT/US2015/065869, filed on Dec. 15, 2015.

(60) Provisional application No. 62/092,074, filed on Dec. 15, 2014.

(51) Int. Cl.
| | |
|---|---|
| *H01L 21/02* | (2006.01) |
| *H01L 21/302* | (2006.01) |
| *H01L 21/324* | (2006.01) |
| *H01L 21/265* | (2006.01) |
| *H01L 21/311* | (2006.01) |
| *H01L 21/306* | (2006.01) |

(52) U.S. Cl.
CPC .. *H01L 21/02236* (2013.01); *H01L 21/02255* (2013.01); *H01L 21/02381* (2013.01); *H01L 21/02532* (2013.01); *H01L 21/02664* (2013.01); *H01L 21/26513* (2013.01); *H01L 21/302* (2013.01); *H01L 21/31111* (2013.01); *H01L 21/3247* (2013.01); *H01L 21/30604* (2013.01)

(58) Field of Classification Search
CPC combination set(s) only.
See application file for complete search history.

(56) References Cited

U.S. PATENT DOCUMENTS

| | | |
|---|---|---|
| 6,352,942 B1 | 3/2002 | Luan et al. |
| 2005/0139961 A1 | 6/2005 | Brunner et al. |
| 2006/0141748 A1 | 6/2006 | Daval et al. |
| 2011/0045654 A1 | 2/2011 | Martinez et al. |
| 2014/0285980 A1* | 9/2014 | Cappellani .............. H01L 21/76 361/748 |
| 2016/0343806 A1* | 11/2016 | Siddiqui ............... H01L 29/161 |

OTHER PUBLICATIONS

Stratio, Inc., International Search Report and Written Opinion, PCTUS2015/065869, Feb. 9, 2016, 7 pgs.
Stratio, Inc., International Preliminary Report on Patentability, PCTUS2015/065869, Jun. 20, 2017, 5 pgs.

* cited by examiner

*Primary Examiner* — Charles D Garber
*Assistant Examiner* — Steven M Christopher
(74) *Attorney, Agent, or Firm* — Morgan, Lewis & Bockius LLP

(57) ABSTRACT

Methods for reducing surface roughness of germanium are described herein. In some embodiments, the surface roughness is reduced by thermal oxidation of germanium. In some embodiments, the surface roughness is further reduced by controlling a rate of the thermal oxidation. In some embodiments, the surface roughness is reduced by thermal annealing.

15 Claims, 8 Drawing Sheets

500

502 Obtain a substrate that includes a layer of germanium

504 Process the layer of germanium with ion implantation.

506 Form an oxide layer over the layer of germanium

508 Process the layer of germanium with ion implantation

510 Oxidize a portion of the layer of germanium through thermal oxidation

512 Remove at least a subset of the oxidized portion of the layer of germanium

REDUCTION OF SURFACE ROUGHNESS IN EPITAXIALLY GROWN GERMANIUM BY CONTROLLED THERMAL OXIDATION

RELATED APPLICATIONS

This application is a continuation application of International Patent Application No. PCT/US2015/065869, filed Dec. 15, 2015, which claims priority to U.S. Provisional Patent Application Ser. No. 62/092,074, filed Dec. 15, 2014. Both of these applications are incorporated by reference herein in their entireties.

TECHNICAL FIELD

This application relates generally to methods for reducing surface roughness of semiconductor substrates, including but not limited to methods for reducing surface roughness of germanium substrates.

BACKGROUND

For today's transistor fabrication, the surface of the semiconductor substrate has to be extremely smooth. This is because any roughness on the semiconductor substrate is a source for surface roughness scattering that degrades carrier mobility during operation of a metal-oxide-semiconductor field-effect-transistor (MOSFET). In silicon (Si) MOSFET production industry, the requirement for an electronic device-grade Si surface is a surface roughness of 2 Å. For silicon, this is mainly achieved by chemical mechanical polishing (CMP) prior to any fabrication. In addition, to mitigate surface/sidewall roughness caused by etching, ion implantation, and other processes, a thin thermal oxide is intentionally grown and removed.

Germanium (Ge) is a candidate material for next generation devices (MOSFETs) because it has higher carrier mobility than Si and is compatible with traditional Si Complementary Metal-Oxide-Semiconductor (CMOS) processes. However, epitaxially grown Ge (epi-Ge) on Si typically has a root-mean-square (rms) roughness of about 7 Å because of a 4% lattice mismatch. Even with bulk Ge, the surface cannot recover to its original roughness following extra-heavy ion implantation during which void-like structures form on the surface that cannot be recovered with thermal annealing. This needs to be reduced before forming Ge-based MOSFET devices. Although surface roughness can be reduced via CMP, it is tricky to do so during device processing without risking damage to other elements in the device.

SUMMARY

There is a need for methods that reduce surface roughness in epitaxially grown Ge. A number of embodiments that reduce surface roughness in epitaxially grown Ge is presented in more detail below. Forming and removing an oxide layer can reduce surface roughness because rough features in the surface oxidize faster than relatively flat features due to larger surface area exposure.

In accordance with some embodiments, a method for reducing surface roughness in germanium is disclosed. The method includes obtaining a substrate that includes a layer of germanium; and oxidizing a portion of the layer of germanium through thermal oxidation.

Such a method and other methods described herein may replace conventional methods for reducing surface roughness. Alternatively, such methods may complement the conventional methods for reducing surface roughness.

BRIEF DESCRIPTION OF THE DRAWINGS

For a better understanding of the aforementioned aspects as well as additional aspects and embodiments, reference should be made to the Description of Embodiments below.

DESCRIPTION OF EMBODIMENTS

Figure 1A:
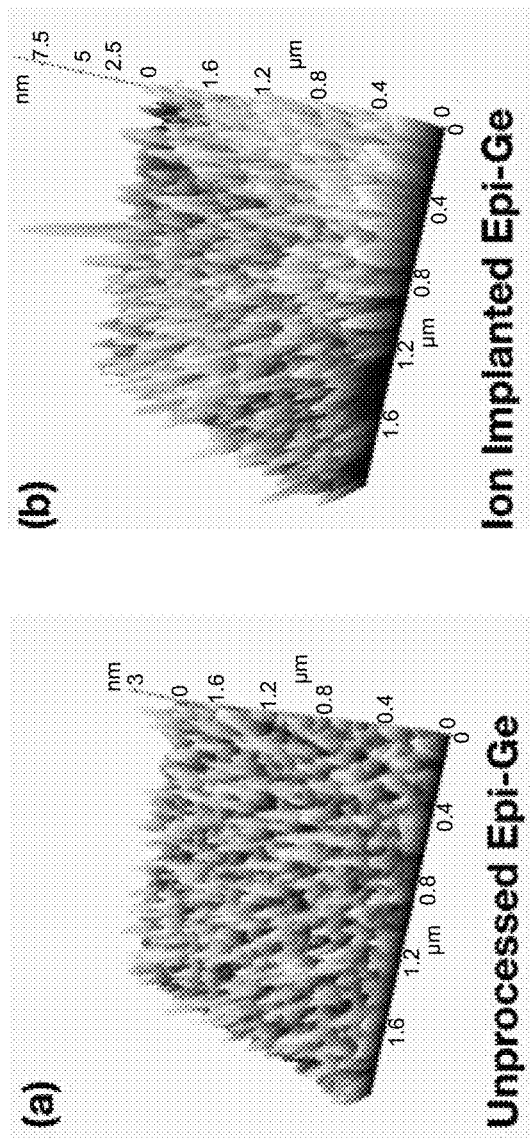
FIG. 1A illustrates AFM images of unprocessed epi-Ge, ion-implanted epi-Ge, and epi-Ge substrates thermally oxidized after ion-implantation in accordance with some embodiments.
Figure 1A:
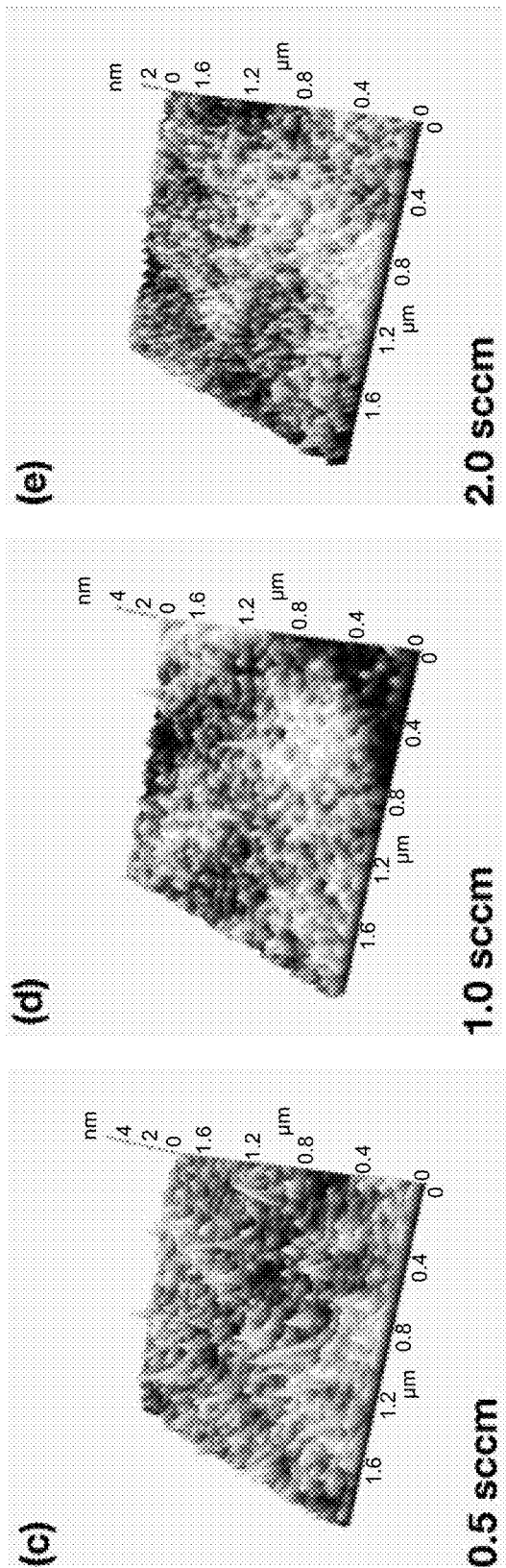

Methods described herein allow for reducing surface roughness of germanium. By using methods described herein, reduced surface roughness of 2 Å was achieved. Details of several embodiments are discussed below.

Reference will be made to certain embodiments, examples of which are illustrated in the accompanying drawings. While the claims will be described in conjunction with the described embodiments, it will be understood that it is not intended to limit the claims to these particular embodiments alone. On the contrary, the embodiments are intended to cover alternatives, modifications and equivalents that are within the spirit and scope of the appended claims.

Moreover, in the following description, numerous specific details are set forth to provide a thorough understanding of the embodiments. However, it will be apparent to one of ordinary skill in the art that the embodiments may be practiced without these particular details. In other instances, components and procedures that are well-known to those of ordinary skill in the art are not described in detail to avoid obscuring aspects of the embodiments.

It will also be understood that, although the terms first, second, etc. may be used herein to describe various elements, these elements should not be limited by these terms. These terms are only used to distinguish one element from another. For example, a first group could be termed a second group, and, similarly, a second group could be termed a first group, without departing from the scope of the claims. The first group and the second group are both groups, but they are not the same group.

The terminology used in the description of the embodiments herein is for the purpose of describing particular embodiments only and is not intended to be limiting of the invention. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In developing the methods for reducing surface roughness of germanium, undoped Ge substrates were grown heteroepitaxially on a p-type Si wafer with a thickness of ~2.0 μm. After growth, the wafers were split into two groups. Some of the wafers in the first group were implanted with a $1.8 \times 10^{15}/cm^2$ dose of phosphorous (P) ions at 90 keV. Some of the wafers in the second group were deposited with ~20 nm low temperature silicon oxide (LTO) that was grown on top of epi-Ge at 300° C. The second group then went through the same ion implantation process as the first group. For both groups, some of the wafers were subjected to thermal oxidation (which is essentially $GeO_2$ formation) in a rapid thermal system (RTA) using various $O_2$ flows from 0.5 sccm (standard cubic centimeters per minute) to 2.0 sccm at 400° C. for 1 min. After the oxidation step, any remaining $GeO_2$ and LTO were stripped from both groups using a 2% HF (hydrofluoride) solution.

In addition, to investigate the effect of annealing temperature on surface roughness, some unprocessed samples from the second group were exposed to various annealing temperatures from 400° C. to 700° C. for 1 min in an $N_2$ ambient (0 sccm of $O_2$ flow) environment. After the annealing, the LTO layer was stripped off by 2% HF solution. Surface roughness of the fabricated samples was observed using an AFM system, where a 5 μm×5 μm area was scanned and analyzed.

Although the above-paragraph describes that two groups of wafer fragments were formed during the investigation, it is not necessary to form the two groups of wafer fragments. For example, in some embodiments, an entire wafer is deposited with low temperature silicon oxide. Thus, the second group may be formed without forming the first group.

Figure 1B:
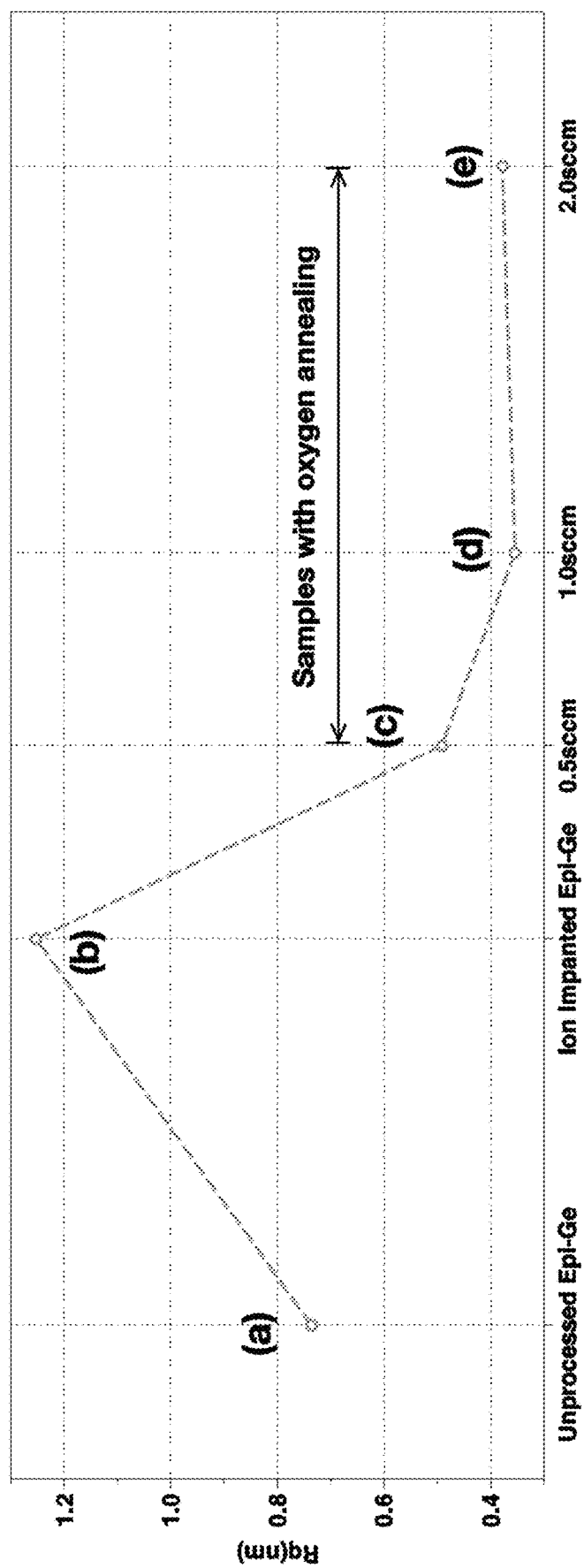
FIG. 1B is a plot of Rq values for the epi-Ge substrates shown in FIG. 1A.

FIG. 1A illustrates AFM images of (a) unprocessed epi-Ge, (b) ion-implanted epi-Ge, and thermally oxidized epi-Ge substrates ((c) thermally oxidized in the presence of 0.5 sccm $O_2$ flow, (d) thermally oxidized in the presence of 1.0 sccm $O_2$ flow, and (e) thermally oxidized in the presence of 2.0 sccm $O_2$ flow) in accordance with some embodiments. FIG. 1B is a plot of Rq values (root-mean-squared surface roughness parameter) for the (a) un-processed epi-Ge substrates, (b) ion-implanted epi-Ge substrates, and thermally oxidized epi-Ge substrates ((c) through (e)) shown in FIG. 1A.

As shown in FIG. 1B, the surface roughness of the ion-implanted sample increases by a factor of 1.7 compared to the unprocessed epi-Ge (e.g., an epi-Ge substrate that is not ion-implanted), from approximately 7 Å to over 12 Å. The constant impact of phosphorous ions on the surface may contribute to the surface roughness. In addition, residual stress relaxation from the Ge and Si interface may contribute to the surface roughness. Regardless of the cause of the increased surface roughness, if the Ge surface becomes rough from n-well or p-well implantation during Ge MOSFET fabrication, the surface will not be suitable for gate-stack formation.

In some embodiments, surface roughness is reduced by oxidizing the surface by thermal oxidation, which allows the extrusions on the surface to oxidize faster, resulting in a smoother surface when the oxide is removed. For Si, this is accomplished by using a dry oxidation, growing just enough $SiO_2$ to cover the peak-to-peak and lateral dimensions of the roughness. For Ge, native oxide formation ($GeO_2$) can occur at temperatures as low as 100° C. and GeO desorption begins to occur at around 400-550° C. The GeO desorption effect occurs because of oxygen vacancy interactions with Ge at the surface, which eventually desorbs above a certain temperature. In some embodiments, the thermal oxidation temperature is set at 400° C. to exclude the GeO desorption effect. During oxidation, it is also important to control the rate at which $GeO_2$ forms on the surface of the Ge. Fast and uncontrolled $GeO_2$ growth could potentially increase surface roughness. In some embodiments, the P-implanted Ge samples are exposed to 0.5 to 2.0 sccm of $O_2$ flow during thermal annealing at 400° C. As described above, their AFM measurements are shown in FIGS. 1A and 1B ((c) through (e)).

Figure 2:
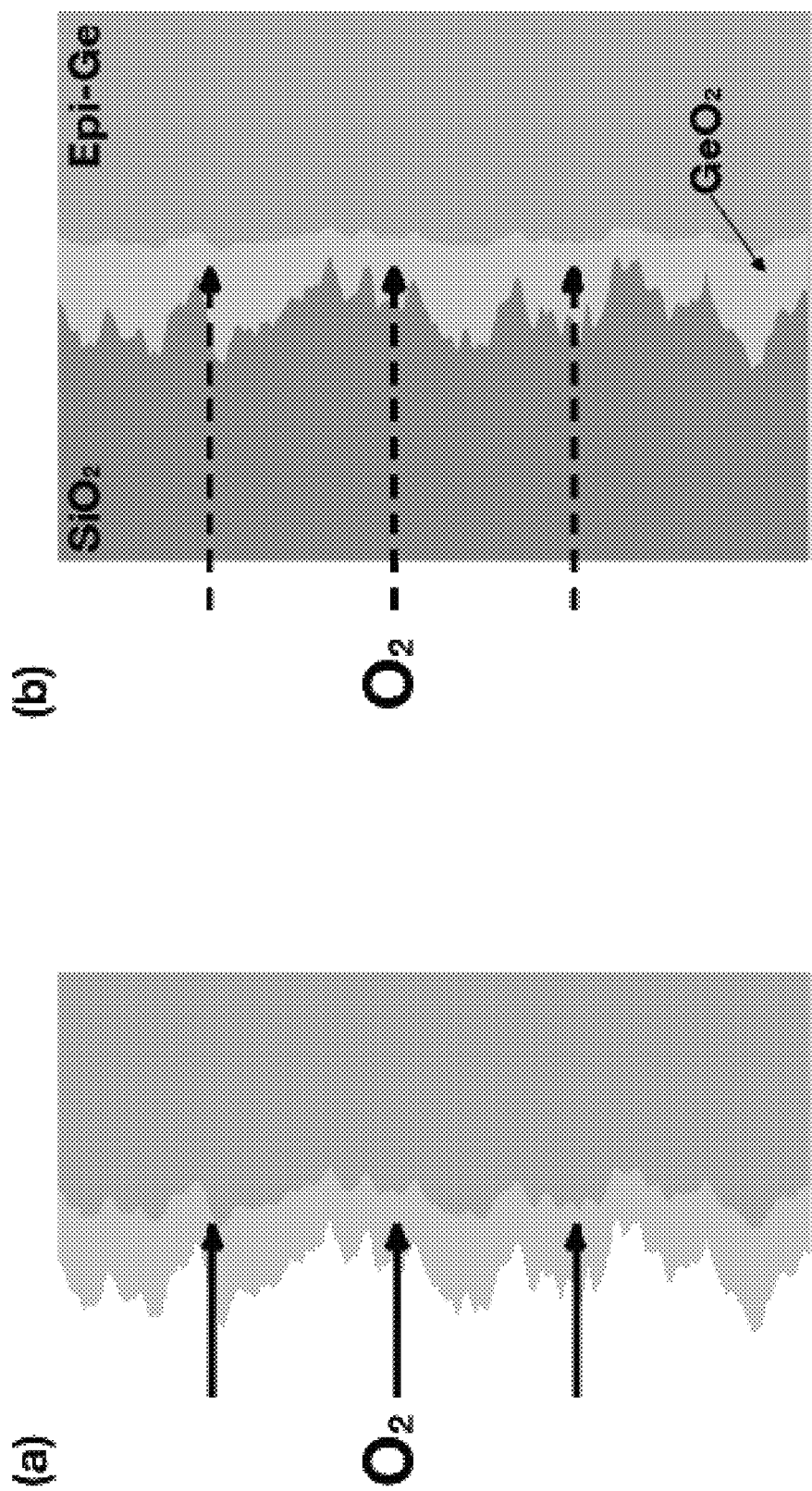
FIG. 2 includes conceptual diagrams illustrating reaction-limited and diffusion limited Ge oxidation.

In some embodiments, the P-implanted sample has an rms roughness of ~12 Å, as shown in FIG. 1B. The surface roughness was reduced to approximately 4.9 Å with 0.5 sccm, which shows the significant advantage of oxidation as a way to reduce the surface roughness in germanium. The surface roughness was further reduced with an increased $O_2$ flow of about 1.0 sccm. It is believed that, at this point, initial $GeO_2$ growth during thermal annealing is reaction limited (e.g., see illustration (a) in FIG. 2) before becoming diffusion limited due to the thickness of the existing $GeO_2$.

Without limiting the scope of claims, it is believed that small variations in $O_2$ concentration across the surface can result in different $GeO_2$ growth, which is unfavorable for obtaining an extremely smooth surface. Thus, a better way of controlling the rate at which $O_2$ reaches the Ge surface is needed. In order to accomplish this, low temperature oxide (LTO) (e.g., with thickness of 20 nm) is deposited on top of the Ge surface. The oxide makes the $GeO_2$ formation diffusion limited (e.g., see illustration (b) in FIG. 2), as the $O_2$ would have to diffuse through the oxide to reach the Ge layer. In addition, the oxide can be used to protect the surface from ion-implantation bombardment.

Figure 3A:
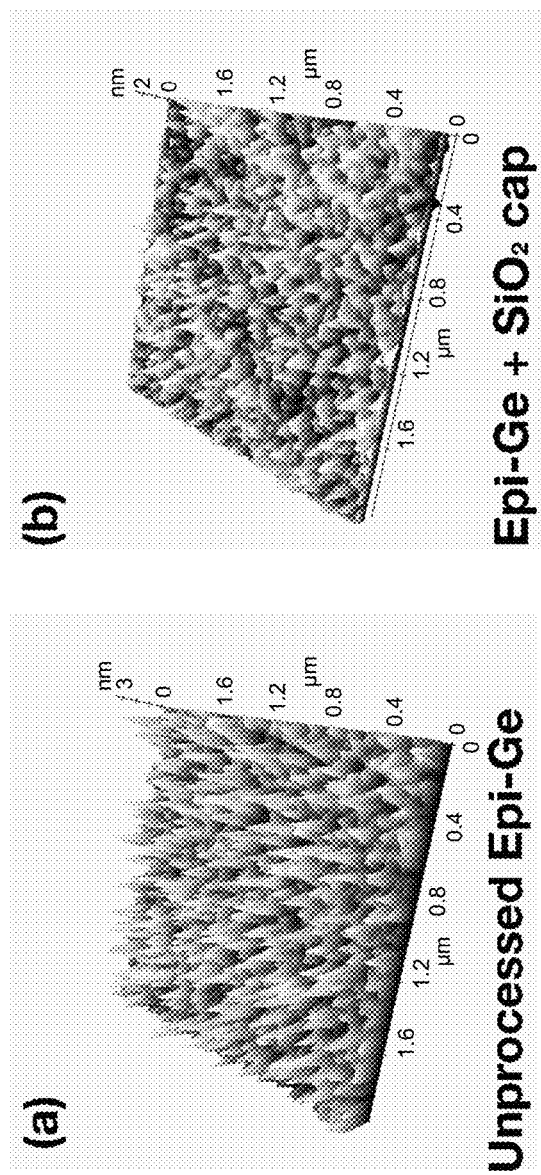
FIG. 3A shows AFM images of un-processed epi-Ge, low temperature oxide (LTO)-capped epi-Ge after ion-implantation, and LTO-capped epi-Ge substrates thermally oxidized after ion-implantation in accordance with some embodiments.
Figure 3A:
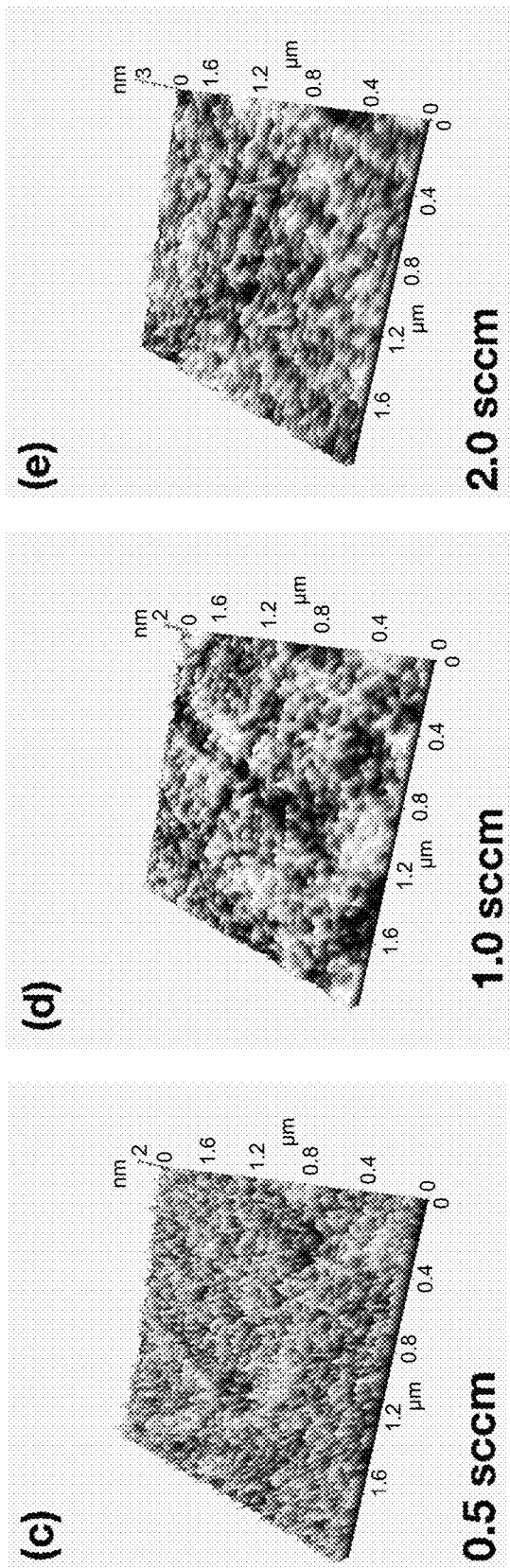
Figure 3B:
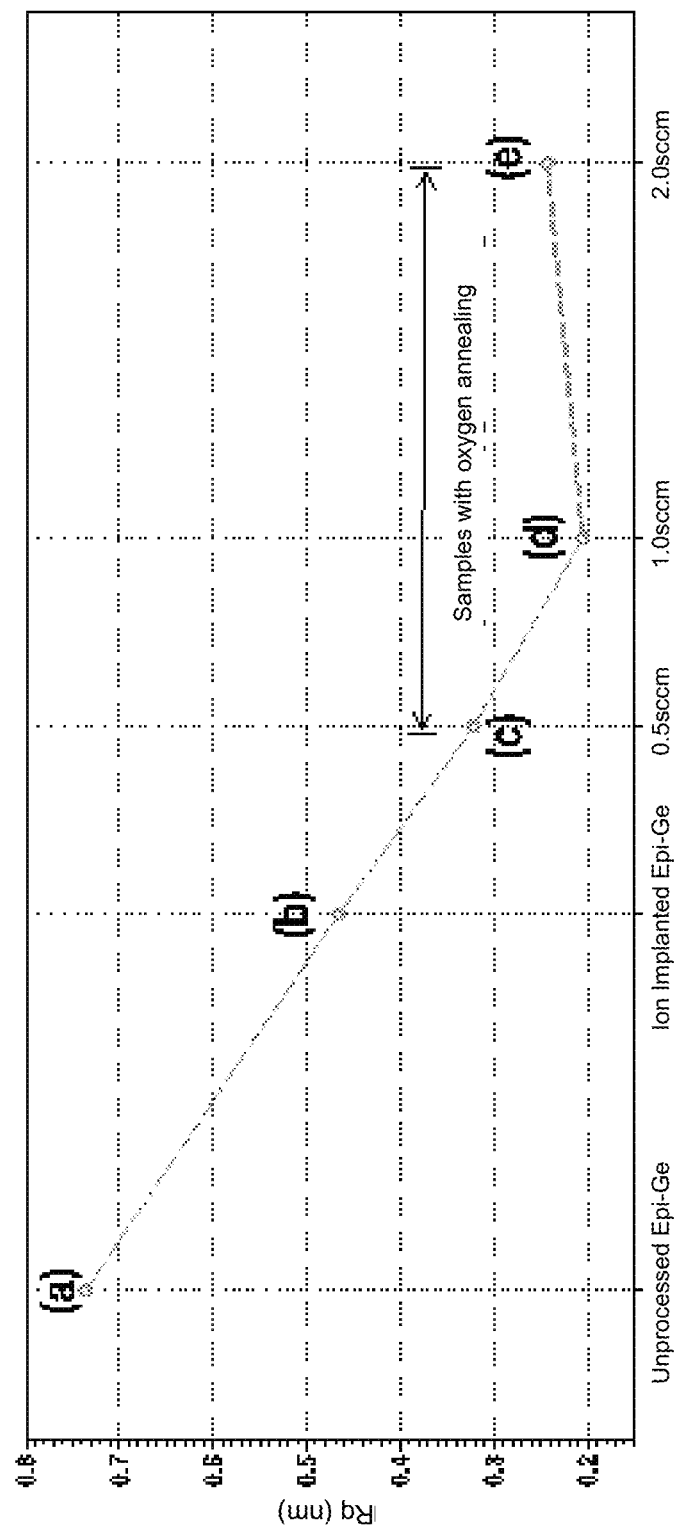
FIG. 3B is a plot of Rq (root-mean-square surface roughness) values for the LTO-capped epi-Ge substrates shown in FIG. 3A.

FIG. 3A illustrates AFM images of (a) unprocessed epi-Ge, (b) LTO-capped epi-Ge after ion-implantation, and LTO-capped epi-Ge substrates after ion-implantation and thermally oxidation ((c) thermally oxidized in the presence of 0.5 sccm $O_2$ flow, (d) thermally oxidized in the presence of 1.0 sccm $O_2$ flow, and (e) thermally oxidized in the presence of 2.0 sccm $O_2$ flow) in accordance with some embodiments. FIG. 3B is a plot of Rq values for the substrates shown in FIG. 3A.

In some embodiments, LTO deposition involves $SiH_4$ and $O_2$ flow in a 300° C. environment, which forms $GeO_2$. In some cases, the $GeO_2$ layer further reduces the rms roughness by a factor of 0.49 compared to an unprocessed epi-Ge substrate.

FIGS. 3A and 3B also show the surface roughness after the oxidation process at 400° C. with different $O_2$ flows between 0.5 to 2.0 sccm. Reduction of surface roughness is more evident than in the absence of LTO capping (e.g., FIGS. 1A and 1B). It is thought that because oxidation was diffusion limited, GeO$_2$ formation was slower and more uniform, resulting in a very smooth surface. We achieved an especially smooth surface in the case where the O$_2$ flow was 1.0 sccm, resulting in an electronic-grade Ge surface with rms roughness of about 2 Å. This is a huge improvement considering the fact that the starting rms roughness of our un-processed epi-Ge substrate was over 7 Å.

Figure 4A:
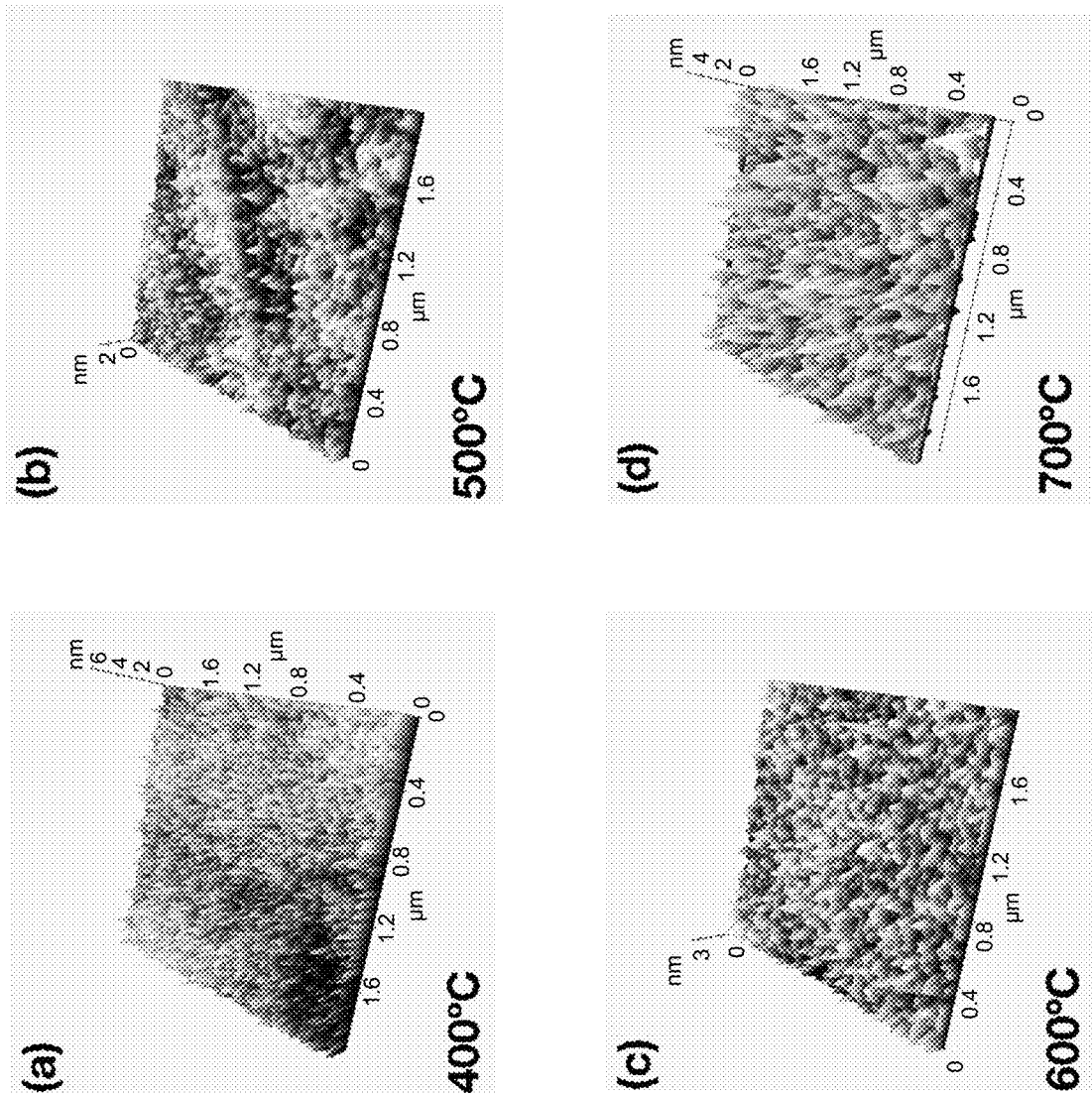
FIG. 4A shows AFM images of LTO-capped epi-Ge samples annealed at various temperatures from 400° C. to 700° C. in an $N_2$ ambient, in accordance with some embodiments.
Figure 4B:
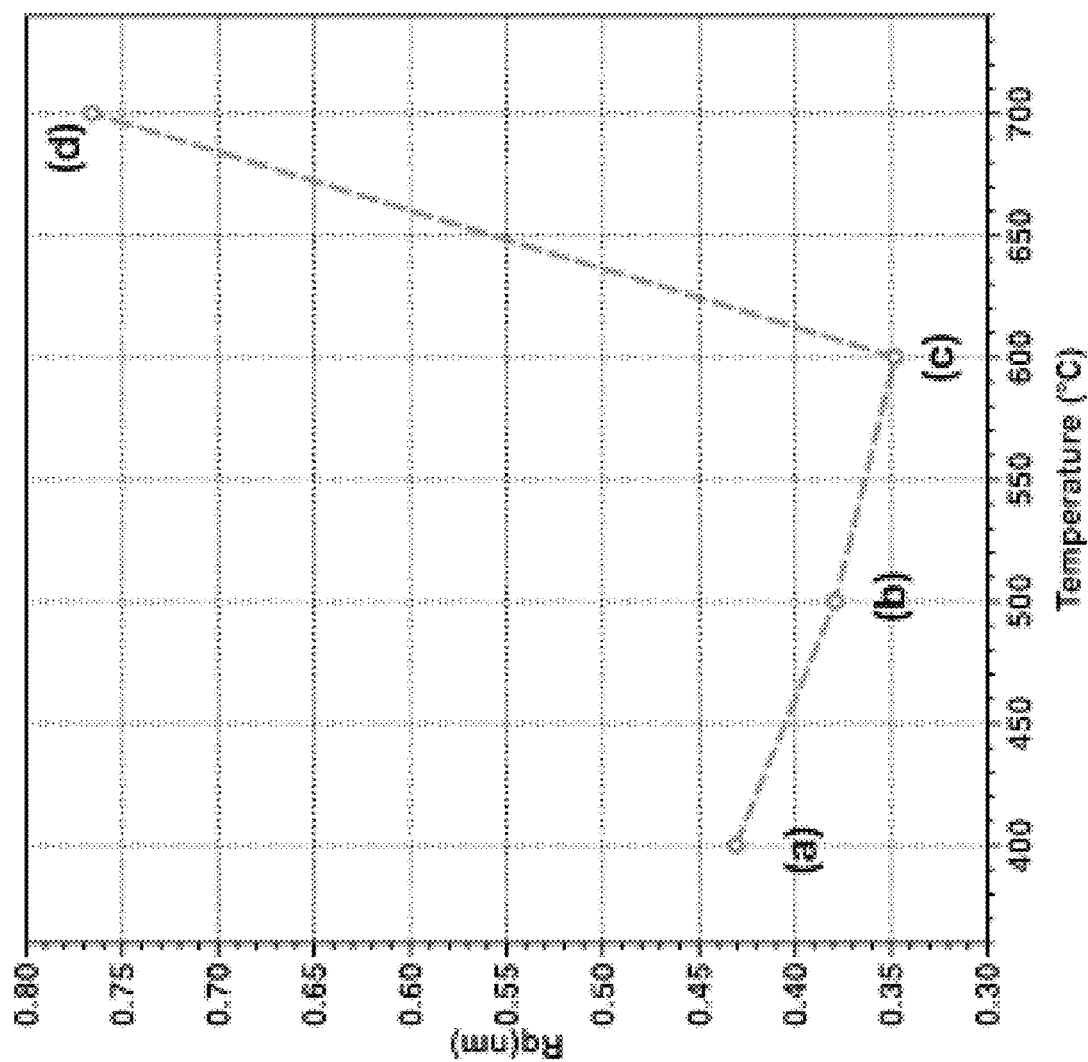
FIG. 4B is a plot of Rq (root-mean-square surface roughness) values for the LTO-capped epi-Ge samples shown in FIG. 4A.

In some embodiments, during thermal processing, it is believed, without limiting the scope of claims, that Ge atoms would diffuse across the surface in order to find the lowest state of energy. To isolate this effect, LTO-capped samples are annealed from 400° C. to 700° C. in an N$_2$ ambient chamber with no O$_2$ flow. FIG. 4A shows AFM images of LTO-capped epi-Ge samples annealed at various temperatures from 400° C. to 700° C. in an N$_2$ ambient, in accordance with some embodiments. FIG. 4B is a plot of Rq values for the LTO-capped epi-Ge samples shown in FIG. 4A.

As seen in FIGS. 4A and 4B, there is reduction of Rq in the 500° C. and 600° C. samples by a factor of approximately 0.8 and 0.9, respectively. The Rq reduction here is thought to be the result of GeO desorption. The changes to the Rq value is especially prominent at 700° C., where the Rq value shoots up to 7 Å, which is comparable to the Rq value of an unprocessed epi-Ge substrate. Nevertheless, the minimum Rq value was above 3 Å, which is worse than surface roughness reduction through thermal oxidation alone.

As described above, it is found that the surface of epi-Ge is roughened during growth and even further roughened by traditional device processes such as ion implantation. With oxidation of the surface, roughness can be reduced to approximately 3 Å in some cases. In order to achieve an electronic grade (surface roughness of ~2 Å) substrate, controlling the rate at which O$_2$ reaches the surface is critical. By placing a thin SiO$_2$ capping layer on top of the epi-Ge in some cases, the rate at which O$_2$ reaches the surface becomes diffusion limited, resulting in oxidation that is better controlled than that of reaction limited oxidation. Under these conditions, an excellent surface roughness of approximately 2.02 Å is achieved.

Figure 5:
FIG. 5 is a flow diagram illustrating a method for reducing surface roughness in germanium in accordance with some embodiments.
Figure 5:
Figure 5:
Figure 5:
Figure 5:

FIG. 5 is a flow diagram illustrating method 500 of reducing surface roughness in germanium in accordance with some embodiments.

Method 500 includes obtaining (502) a substrate that includes a layer of germanium. In some embodiments, the substrate includes a layer of epitaxially grown germanium. In some embodiments, the layer of germanium is epitaxially grown. In some embodiments, the layer of germanium is epitaxially grown on a silicon substrate. In some embodiments, the layer of germanium is at least 10 nm thick. In some embodiments, the layer of germanium is at least 20 nm thick. In some embodiments, the layer of germanium is at least 100 nm thick. In some embodiments, the layer of germanium is at least 200 nm thick. In some embodiments, the layer of germanium is at least 1000 nm thick. In some embodiments, the layer of germanium is at least 2000 nm thick. In some embodiments, the layer of germanium is no more than 10000 nm thick. In some embodiments, the layer of germanium is no more than 5000 nm thick. In some embodiments, the substrate is a silicon substrate.

In some embodiments, the layer of germanium is ion implanted.

In some embodiments, method 500 further includes, prior to oxidizing the portion of the layer of germanium through thermal oxidation, forming (506) an oxide layer over the layer of germanium (e.g., a SiO$_2$ layer shown in FIG. 2(b)).

In some embodiments, method 500 further includes, prior to forming the oxide layer, processing (504) the layer of germanium with ion implantation. In some embodiments, method 500 further includes, subsequent to forming the oxide layer, processing (508) the layer of germanium with ion implantation.

In some embodiments, the oxide layer includes silicon oxide. In some embodiments, the silicon oxide is low temperature silicon oxide. In some embodiments, forming the oxide layer includes depositing the silicon oxide. In some embodiments, the silicon oxide is deposited at a temperature between 100 C and 500 C. In some embodiments, the silicon oxide is deposited at a temperature between 200 C and 400 C. In some embodiments, the silicon oxide is deposited at a temperature between 250 C and 350 C. In some embodiments, the silicon oxide is deposited at 300 C. In some embodiments, the silicon oxide is less than 100 nm thick. In some embodiments, the silicon oxide is between 10 and 30 nm thick. In some embodiments, the silicon oxide is between 15 and 25 nm thick. In some embodiments, the silicon oxide is 20 nm thick.

In some embodiments, the oxide layer includes germanium oxide.

Method 500 also includes oxidizing (510) a portion of the layer of germanium through thermal oxidation (e.g., GeO$_2$ shown in FIG. 2(b)).

In some embodiments, oxidizing the portion of the layer of germanium through thermal oxidation includes maintaining the layer of germanium at a temperature between 100 C and 650 C. In some embodiments, oxidizing the portion of the layer of germanium through thermal oxidation includes maintaining the layer of germanium at a temperature between 100 C and 600 C. In some embodiments, oxidizing the portion of the layer of germanium through thermal oxidation includes maintaining the layer of germanium at a temperature between 550 C and 650 C. In some embodiments, oxidizing the portion of the layer of germanium through thermal oxidation includes maintaining the layer of germanium at a temperature between 100 C and 400 C. In some embodiments, oxidizing the portion of the layer of germanium through thermal oxidation includes maintaining the layer of germanium at a temperature between 300 C and 500 C. In some embodiments, oxidizing the portion of the layer of germanium through thermal oxidation includes maintaining the layer of germanium at a temperature between 350 C and 450 C. In some embodiments, oxidizing the portion of the layer of germanium through thermal oxidation includes maintaining the layer of germanium at 400 C.

In some embodiments, oxidizing the portion of the layer of germanium through thermal oxidation includes exposing the substrate to a flow of O$_2$ at less than 10 sccm. In some embodiments, oxidizing the portion of the layer of germanium through thermal oxidation includes exposing the substrate to a flow of O$_2$ at less than 5 sccm. In some embodiments, oxidizing the portion of the layer of germanium through thermal oxidation includes exposing the substrate to a flow of O$_2$ at less than 2 sccm. In some embodiments, oxidizing the portion of the layer of germanium through thermal oxidation includes exposing the substrate to a flow of O$_2$ between 0.5 sccm and 2 sccm. In some embodiments, oxidizing the portion of the layer of germanium through thermal oxidation includes exposing the substrate to a flow of O$_2$ between 0.8 sccm and 1.2 sccm. In some embodiments, oxidizing the portion of the layer of germanium through thermal oxidation includes exposing the substrate to a flow of O$_2$ at 1 sccm.

In some embodiments, method 500 includes removing (512) at least a subset of the oxidized portion of the layer of germanium (e.g., using a 2% HF solution).

The foregoing description, for purpose of explanation, has been described with reference to specific embodiments. However, the illustrative discussions above are not intended to be exhaustive or to limit the scope of claims to the precise forms disclosed. Many modifications and variations are possible in view of the above teachings. The embodiments were chosen and described in order to best explain the particular principles and their practical applications, to thereby enable others skilled in the art to best utilize the principles and various embodiments with various modifications as are suited to the particular use contemplated.

What is claimed is:

1. A method for reducing surface roughness in germanium, the method comprising:
   obtaining a substrate that includes a layer of germanium that has a top surface having a first surface roughness;
   depositing a capping layer of silicon oxide on the top surface of the layer of germanium so that the capping layer covers the entire top surface of the layer of germanium; and
   subsequent to the depositing, oxidizing the top surface of the layer of germanium through thermal oxidation by diffusing oxygen through the capping layer into the layer of germanium so that the top surface of the layer of germanium is converted into a layer of germanium oxide located on top of an unoxidized layer of germanium, causing a top surface of the unoxidized layer of germanium to have a second surface roughness that is less than the first surface roughness.

2. The method of claim 1, further comprising:
   removing at least a subset of the layer of germanium oxide.

3. The method of claim 1, wherein the substrate is a silicon substrate with the layer of germanium thereon.

4. The method of claim 3, wherein the layer of germanium is a layer of epitaxially grown germanium.

5. The method of claim 1, wherein the layer of germanium is a layer of epitaxially grown germanium.

6. The method of claim 1, wherein the layer of germanium is at least 10 nm thick.

7. The method of claim 1, wherein the layer of germanium is no more than 5000 nm thick.

8. The method of claim 1, wherein the capping layer of silicon oxide is low temperature silicon oxide.

9. The method of claim 1, wherein the capping layer of silicon oxide is deposited at a temperature between 100° C. and 500° C.

10. The method of claim 1, wherein the capping layer of silicon oxide is less than 100 nm thick.

11. The method of claim 1, further comprising:
    subsequent to the depositing of the capping layer of silicon oxide, processing the layer of germanium with ion implantation.

12. The method of claim 1, wherein the layer of germanium is ion implanted.

13. The method of claim 1, wherein oxidizing the top surface of the layer of germanium through thermal oxidation includes maintaining the layer of germanium at a temperature between 100° C. and 650° C.

14. The method of claim 13, wherein oxidizing the top surface of the layer of germanium through thermal oxidation includes exposing the substrate to a flow of $O_2$ at less than 10 sccm.

15. The method of claim 1, wherein oxidizing the top surface of the layer of germanium through thermal oxidation includes exposing the substrate to a flow of $O_2$ at less than 10 sccm.

* * * * *